(12) United States Patent
Lin

(10) Patent No.: US 6,827,140 B2
(45) Date of Patent: Dec. 7, 2004

(54) RADIATOR (1)

(76) Inventor: Hai-Ching Lin, No. 9-1, Wa Yao Keng, Shoei Yuan Li, Dann Shoei Cheng, Taipei (TW)

(*) Notice: Subject to any disclaimer, the term of this patent is extended or adjusted under 35 U.S.C. 154(b) by 0 days.

(21) Appl. No.: 10/145,742

(22) Filed: May 16, 2002

(65) Prior Publication Data

US 2003/0213589 A1 Nov. 20, 2003

(51) Int. Cl.[7] ............................. F28F 7/00; H01L 23/34
(52) U.S. Cl. ....................... 165/185; 165/80.3; 165/76; 257/718; 361/697
(58) Field of Search ............................... 165/80.3, 185, 165/67, 76, 78, 79; 361/695, 704, 697, 703; 257/722, 718; 174/16.3

(56) References Cited

U.S. PATENT DOCUMENTS

| | | | | |
|---|---|---|---|---|
| 5,201,866 A | * | 4/1993 | Mok ......................... | 165/80.3 |
| 6,062,301 A | * | 5/2000 | Lu ............................ | 165/80.3 |
| 6,104,609 A | * | 8/2000 | Chen ......................... | 361/695 |
| 6,266,245 B1 | * | 7/2001 | Wei .......................... | 361/704 |
| 6,269,003 B1 | * | 7/2001 | Wen-Chen .................. | 361/704 |
| 6,386,275 B1 | * | 5/2002 | Kuo et al. .................. | 165/80.3 |
| 6,401,810 B1 | * | 6/2002 | Kuo et al. .................. | 165/185 |
| 6,435,272 B1 | * | 8/2002 | Voss ......................... | 165/182 |
| 6,474,407 B1 | * | 11/2002 | Chang et al. .............. | 165/80.3 |

* cited by examiner

Primary Examiner—Henry Bennett
(74) Attorney, Agent, or Firm—Bacon & Thomas, PLLC

(57) ABSTRACT

A radiator combined laterally or stacked vertically by several dissipation pieces including a plurality of dissipation pieces and at least one frame. Wherein two opposite edges of the dissipation pieces bend inwardly, one of the bending edge is formed to provide with bending at two ends and the middle section between which does not provide with bending edge; the frame is of one kind of closed frame structure, or C-shaped structure with one open end, after above-mentioned dissipation pieces are combined, the frame is established around the combined dissipation pieces, thereby the said combined dissipation pieces are fabricated fixedly.

1 Claim, 4 Drawing Sheets

RADIATOR (1)

BACKGROUND OF THE INVENTION

1. Field of the Invention

The present invention relates to a radiator comprising at least one frame bound a plurality of dissipation pieces provided with bending edge, which can be established with most dissipation pieces under finite space to achieve optimal dissipation effect.

2. Description of the Prior Art

The radiator (shown as FIG. 1) is the essential apparatus in electronic equipment, which collocates with fan (not show) to discharge the heat air in closed electronic devices space so as to avoid the high temperature induced equipment fault. Generally, the combination of the radiator 1 uses the lamination formed from the metals with good heat conductivity, such as Cu, Al, etc. to absorb heat energy, and discharges the heat air through the fan or heat interchange between air. On a common radiator 1, the dissipation pieces 10 for heat dissipation are usually laterally arranged pieces combination (shown as FIG. 1, FIG. 2), and during manufacturing process, generally, these dissipation pieces 10 should be provided with joint hole 11 which will then be bent at two sides, finally, be combined through the joint hole 11, thus it is complicated in procedure, furthermore, the thickness of each lamination is extremely thin and is extremely fine during manufacturing, thus the manufacturing cost increases naturally and the yield is not high. Conventional radiator 10 structure induced another disadvantage that due to the formation of the joint hole 11, it is necessary to move a gap of a trough 12 to be served as the joint space left for jointing with the protruding joint 13, which results that the least thickness of the bending edge 14 of the radiator 10 must be greater that the thickness of the trough 12, thus, even the radiator 10 can be combined with connected dissipation pieces, the distance between pieces is still confined to be greater than or equal to the thickness of the bending edge 14. Above-mentioned radiator 10 structure influences greatly on the manufacture of the radiator 10 due to the sizes of the devices in the electronic equipment are often confined, even the radiator itself is not an exception, and the dissipation effect of the radiator depends on the number of the dissipation pieces, if above-mentioned dissipation pieces 10 structure must be formed to be with the distance of the dissipation pieces comparable with the bending edge 14, in principle, it is hard to achieve the enhancement of dissipation efficiency through increasing the number of dissipation pieces in limited space.

SUMMARY OF THE INVENTION

Under the situation that the dissipation efficiency of the radiator could not be improved through effectively creating new material, it is more possible to increase the dissipation efficiency by increasing the number of the dissipation pieces. Whereas, the present invention provides a radiator structure which can increase more dissipation pieces than conventional radiator under limited space, which includes a plurality of dissipation pieces bound in a frame after combining, wherein the two opposite edges of the dissipation pieces are bent inward to form a bending edge, wherein one bending edge is only formed at two end, the section between which is with no bending edge, due to there is no joint structure provided on the said bending edge, the bending width can achieve minimum such that the distance between every dissipation pieces after combination can be reduced greatly, consequently, more dissipation pieces can be provided in limited width to increase the dissipation efficiency. Because there is no joint structure needed between individual dissipation pieces, the dissipation pieces of the present invention use a frame to bind the individual dissipation pieces in a space to form a radiator. Above-mentioned frame is one kind of closed structure, or a C-shaped structure with one open end and another close end, in principle, the bound position of the said frame does not locate on the non-bending edge of the dissipation pieces resulting from the space of the non-bending edge is served as dissipation. Further, to provide combined stability between the frame and the dissipation pieces, the position of every dissipation pieces serving for the frame can be provided with a hollow of trough so that the frame can be embedded and combined fixedly; alternatively, to provide though hole on the dissipation pieces contacting with the open end of the C-shaped frame, thus the open end of the frame can be embedded into the said groove hole to increase the stable combination. Furthermore, the shape of the bending edge of the dissipation pieces can be any shape which can form minimum piece distance.

DETAILED DESCRIPTION OF THE PREFERRED EMBODIMENT

Figure 6:
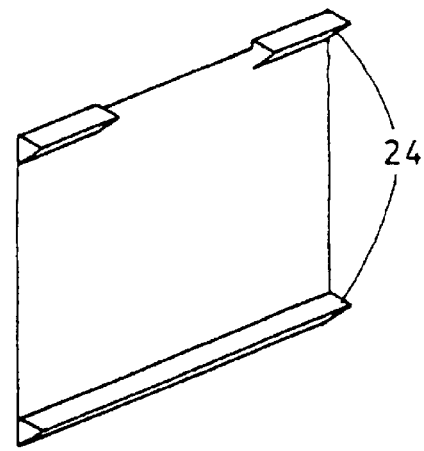
Figure 7:
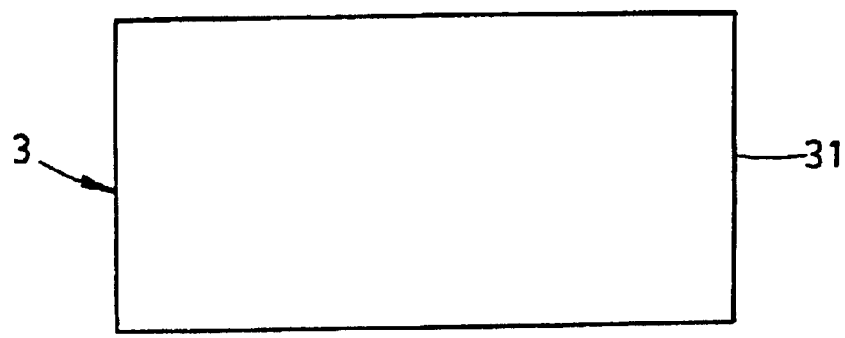
FIGS. 7~9 are front views showing the frame of various embodiment of the present invention.
Figure 8:
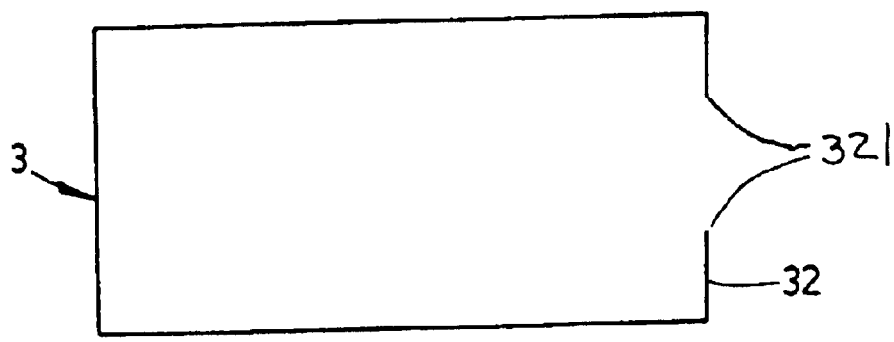
Figure 9:

The preferred embodiment of the present invention includes a plurality of dissipation pieces and at least one frame, wherein the dissipation pieces 2 are one kind of laminated body (shown as FIG. 4), the upper-lower edge can be formed to a bending edges 23, 24, respectively, and the upper bending edge 21 is formed on two ends, the lower bending edge 22 is continuous. The bending edges can also be formed on the left/right side of the dissipation pieces 2(not shown), and the form of which is various, such as the bending edges 23, 24 shown in FIG. 5 and FIG. 6, and any other shape of dissipation pieces which can be formed to be with minimum thickness after bending. Frame 3 shown in FIG. 7 is a closed frame 31. Frame 3 shown in FIGS. 8 and 9 is an open frame 32, 33 with one open end, which can be one kind of a thicker piece body or narrower tape body. Dissipation pieces 2 are laterally provided between the left and right frame body of the frame 3 (shown in FIG. 9), it will be appreciated that after rotating 90 degree for FIG. 9, the dissipation pieces 2 can be stacked between the upper and lower frame body of the frame levelly to form another embodiment. The binding force of the frame 3 is used to collectively bind the dissipation pieces 2 and the dissipation effect can be achieved. While the frame 3 is the C-shaped frame 32 shown as FIG. 8 and FIG. 9, the contact area between the dissipation pieces 2 and the C-shaped frame 32 can be pre-established with groove 25 such that after the dissipation pieces 2 are bound by the frame 32, the open end 321 can be inserted into the groove 25 of the dissipation pieces 2, shown as FIG. 11, thereby the open end 321 can be bound not to bounce out of the dissipation pieces 2, thus the object that the dissipation pieces 2 are bound fixedly can be achieved. The frame 3 of the present invention is not located on the draft open of the dissipation pieces 2, shown as FIG. 12, the non-bending edge section 27 between two end upper bending edge 26 of the dissipation pieces 2 is the draft open of the dissipation pieces 2, the wind power can flow from the left and right side of the dissipation pieces 2, and then discharge through the draft open of the non-bending edge section 27 (shown as the arrow) to discharge the heated air. The draft open of the dissipation pieces 2 can be located anywhere, not limited by the way of the preferred embodiment of the present invention. In the radiator structure shown as FIG. 12, to combine the frame 3 and dissipation pieces 2 more fixedly mutually, a depression 28 may be formed at the position of every pieces of or two previous and afterward pieces of dissipation pieces 2 where the frame 3 is located such that the frame can be avoided from detachment after being located.

Figure 1:
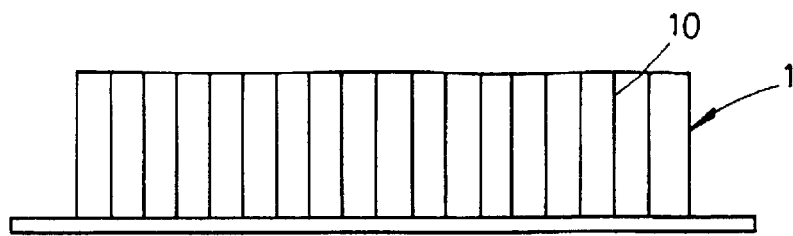
FIG. 1 is a front view showing conventional radiator.
Figure 2:
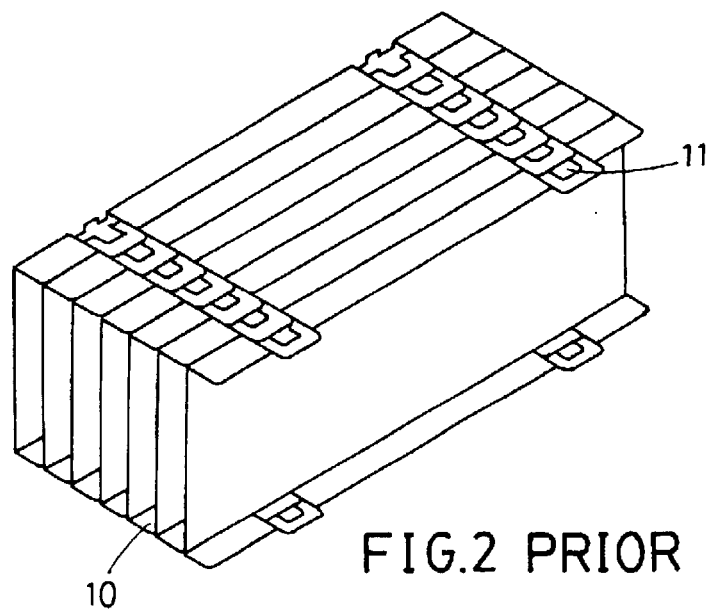
FIG. 2 is an elevational view showing the dissipation pieces of conventional radiator.
Figure 3:
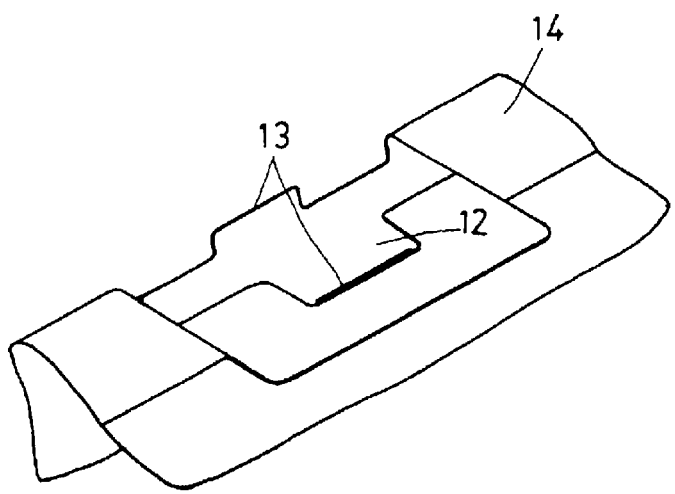
FIG. 3 is an elevational view showing the joint structure of FIG. 2.
Figure 4:
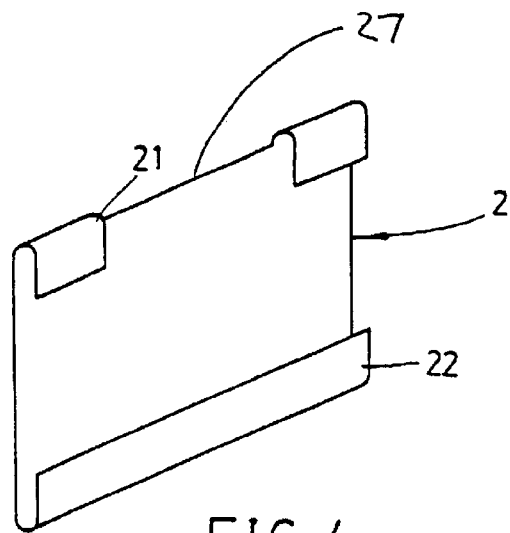
FIGS. 4~6 are elevational views showing the dissipation pieces of various embodiment of the present invention.
Figure 5:
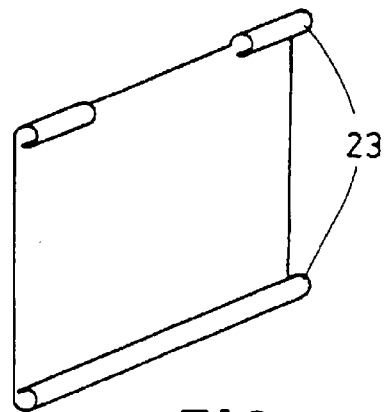
Figure 10:
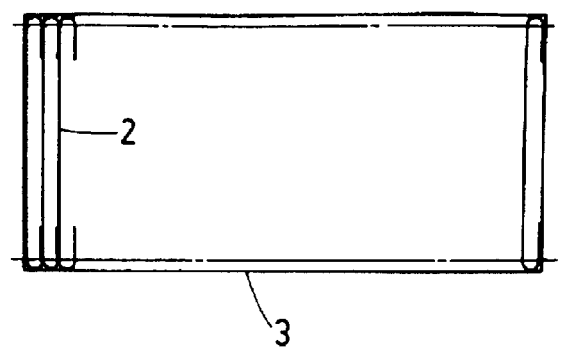
FIG. 10 is a front view showing the combination state of the present invention.

As shown in FIGS. 4 and 10, the radiator includes the frame 3, dissipation pieces 2 that are stacked within the frame 3. The dissipation pieces are contained in position by the frame 3. The dissipation pieces 2 are laminations. Each of the dissipation pieces 2 include upper and lower edges that are inwardly bent to form bending edges 21–24 and 26 (as shown in FIGS. 4–6 and 12) and a non-bending section 27 is formed between the upper and lower edges of the dissipation pieces 2. In FIG. 10, the frame is a closed-type frame sized and configured such that air can pass through gaps formed between adjacent ones of the dissipation pieces.

Figure 11:
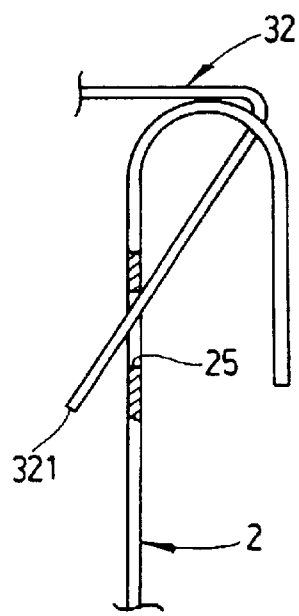
FIG. 11 shows the combination of the dissipation pieces and the frame of the present invention.

As shown in FIG. 11, the frame 3 is an open end-type frame 32 with an open end 321. The open-type frame 32 is positioned between the upper and lower edges of the dissipation piece 2. An end unit of the dissipation pieces 2 includes a groove 25 formed on the non-bending section thereof, through which the open end 321 of the frame is inserted therethrough to lock the dissipation pieces 2 to the frame, such that air can pass through gaps formed between adjacent ones of the dissipation pieces 2.

Figure 12:
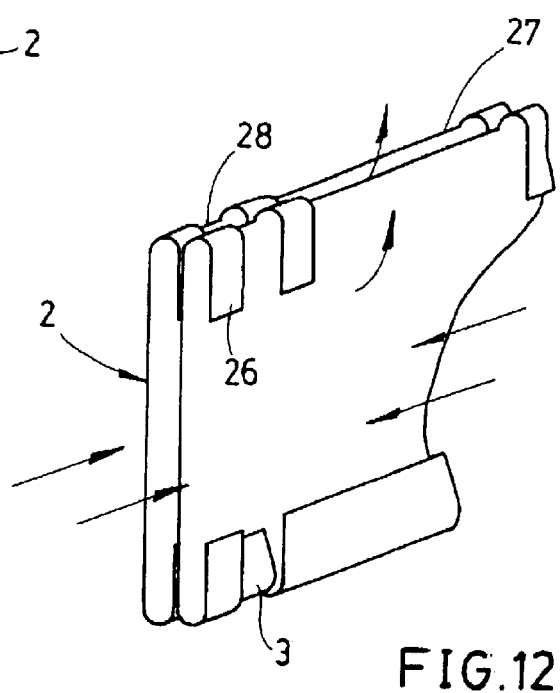
FIG. 12 is a part elevational view showing the combination state of the dissipation pieces and the frame of the present invention.

As shown in FIG. 12, the frame 3 is in contact with only the lower edges of the dissipation pieces 3. The dissipation pieces 2 each comprise depressions 28 between neighboring pairs of the bending edges 26 of the upper edge thereof. Gaps are also formed on the lower edge of the dissipation pieces, such that an open end portion of the frame 3 secures the frame 3 to an end unit of the dissipation pieces 2 through the gaps of the lower edge thereof, such that air can pass through openings formed between adjacent ones of the dissipation pieces 2.

What is claimed is:

1. A radiator comprising:

a unitary frame;

a plurality of dissipation pieces stacked within the unitary frame, the dissipation pieces are contained in position by the frame, the dissipation pieces comprise laminations, each of the dissipation pieces comprises upper and lower edges that are inwardly bent to form bending edges and a non-bending section therebetween, the upper edge comprises at least two of the bending edges;

the unitary frame comprises an open type frame with an open end, the unitary frame surrounds the upper and lower edges of the dissipation pieces;

an end unit of the dissipation pieces comprise a groove formed on the non-bending section thereof, through which the open end of the unitary frame is inserted therethrough to lock the dissipation pieces to the unitary frame, such that air can pass through gaps formed between adjacent ones of the dissipation pieces.

* * * * *